United States Patent
Hong et al.

(10) Patent No.: US 9,620,078 B2
(45) Date of Patent: Apr. 11, 2017

(54) TOUCH DISPLAY APPARATUS AND SHIFT REGISTER THEREOF

(71) Applicant: AU OPTRONICS CORP., Hsin-Chu (TW)

(72) Inventors: Kai-Wei Hong, Hsin-Chu (TW);
Hsiang-Sheng Chang, Hsin-Chu (TW);
Yung-Chih Chen, Hsin-Chu (TW);
Chun-Da Tu, Hsin-Chu (TW);
Cheng-Han Huang, Hsin-Chu (TW);
Chuang-Cheng Yang, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 79 days.

(21) Appl. No.: 14/861,251

(22) Filed: Sep. 22, 2015

(65) Prior Publication Data
US 2016/0365061 A1    Dec. 15, 2016

(30) Foreign Application Priority Data

Jun. 12, 2015 (TW) .............................. 104119139 A (51) Int. Cl.
*G09G 5/00* (2006.01)
*G06F 3/041* (2006.01)
*G11C 19/18* (2006.01)
*G11C 19/28* (2006.01)

(52) U.S. Cl.
CPC .......... *G09G 5/003* (2013.01); *G06F 3/0412* (2013.01); *G06F 3/0416* (2013.01); *G11C 19/184* (2013.01); *G11C 19/28* (2013.01); *G09G 2310/0286* (2013.01); *G09G 2310/0294* (2013.01); *G09G 2310/062* (2013.01)

(58) Field of Classification Search
CPC ... G09G 2310/0286; G09G 2310/0289; G09G 5/003
See application file for complete search history.

(56) References Cited

U.S. PATENT DOCUMENTS

2016/0224175 A1* 8/2016 Moon .................... G06F 3/0412
2016/0335962 A1* 11/2016 Xiao ........................ G09G 3/36

* cited by examiner

*Primary Examiner* — Gerald Johnson
(74) *Attorney, Agent, or Firm* — WPAT, PC; Justin King (57) ABSTRACT

A touch display apparatus includes a touch driver and a display driver. The touch driver outputs touch signals to drive a touch panel. The display driver outputs scan signals to drive a display panel. A display driver has a plurality of shift registers, and each of the plurality of shift registers includes a pull-up unit, a driving unit, a pull-down unit and a holding unit. The pull-up unit is electrically connected to a driving node for outputting a driving voltage. The driving unit is electrically connected to the driving node for outputting a first scan signal according to a clock. A pull-down unit is electrically connected to the driving node and the output terminal, for pulling down the voltage level of the driving voltage and the first scan signal, respectively. The holding unit is electrically connected to the driving node.

19 Claims, 5 Drawing Sheets

FIG.5

TOUCH DISPLAY APPARATUS AND SHIFT REGISTER THEREOF

CROSS-REFERENCE TO RELATED APPLICATIONS

This non-provisional application claims priority under 35 U.S.C. §119(a) on Patent Application No. 104119139 filed in Taiwan, R.O.C. on Jun. 12, 2015, the entire contents of which are hereby incorporated by reference.

BACKGROUND

Technical Field

The present disclosure relates to a display scan device, particularly to a display scan device with a touch function.

Description of the Related Art

Recently, various liquid crystal display products are widely applied to mobile handheld devices, and because smart terminal devices are generally applied to various fields, integrating touch function to the smart terminal devices is the main stream of the current products.

Figure 1:
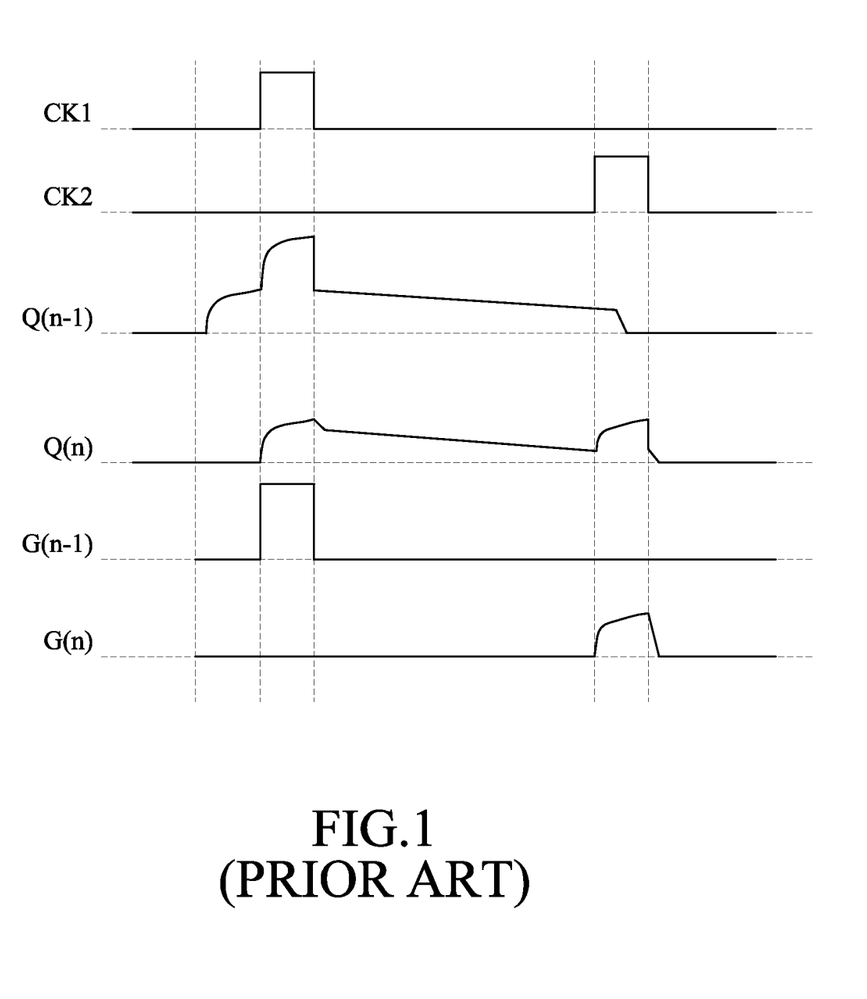
FIG. 1 is a waveform diagram of the shift register in the prior art.

Please refer to FIG. 1. FIG. 1 is a waveform diagram of the shift register in the prior art. As shown in FIG. 1, the touch display apparatus with the touch display function in the prior art activates the touch driver to perform touch driving in the stop-displaying interval. The display driver includes a plurality of shift register circuits, clocks CK1, CK2, scan signals G(n−1), G(n), and driving voltages Q(n−1), Q(n). In every frame, the shift register circuit outputs the scan signal to the display panel according to the clock. For example, the shift register circuit pulls up the driving voltage Q(n−1) of the internal node to output the scan signal G(n−1) according to the clock CK1. In the stop-displaying interval, the shift register stops outputting the display driving signal G(n), and the clock CK and the control signal LC are disabled, so that the driving voltage Q(n) of the node Q is floating and the driving voltage Q(n) of the node Q leaks with time. When the disabled time of the clock CK, the control signal LC, and other external signals are longer, the electric leakage problem of the driving voltage Q(n) is getting serious. When the display driving is resumed, the scan signal G(n−1) outputted from the enabled clock CK2 leaks due to the floating of the internal node in the display driving circuit during the stop-displaying interval, and the problem further results in the incapability of outputting correct voltage level from the scan signal G(n) after the stop-displaying interval. Therefore, the display quality is decreased.

Therefore, how to maintain the display driver not to leak and to output incorrectly during the touch driving period or the stop-displaying interval is a development issue, and the problem becomes a target for improvement in the related fields.

SUMMARY

A touch display apparatus includes a touch driver and a display driver. The touch driver is for outputting a plurality of touch driving signals to drive a touch panel. The display driver is for outputting a plurality of scan signals to drive a display panel, and the display driver has a plurality of shift registers. A $N^{th}$ shift register includes a pull-up unit, a driving unit, a pull-down unit, and a holding unit. The pull-up unit is electrically connected to a driving node, and is for outputting a driving voltage to the driving node. The driving unit is electrically connected to the driving node, and is for outputting a $N^{th}$ scan signal according to a clock. The pull-down unit is electrically connected to the driving node and the output terminal, and is for pulling down the voltage level of the driving voltage and the output terminal respectively according to the $N^{th}$ scan signal and a $M^{th}$ scan signal, wherein N, M are integers and M is greater than N. The holding unit is electrically connected to the driving node, wherein in a stop-displaying interval after the outputting a $(N-1)^{th}$ scan signal, the holding unit is enabled according to an enabling signal to maintain the voltage level of the driving voltage, and the clock is disabled to disable the $N^{th}$ scan signal, and after the stop-displaying interval, the enabling signal is disabled and the clock is enabled to enable the $N^{th}$ scan signal.

A shift register includes a pull-up unit, a driving unit, a pull-down unit, and a holding unit. The pull-up unit is electrically connected to a driving node, and is for outputting a driving voltage to the driving node. The driving unit is electrically connected to the driving node, and is for outputting a first scan signal to an output terminal according to a clock. The pull-down unit is electrically connected to the driving node and the output terminal, and is for pulling down the voltage level of the driving voltage and the output terminal respectively according to the first scan signal and a second scan signal. The holding unit is electrically connected to the driving node, wherein in a stop-displaying interval, the first scan signal is disabled and an enabling signal is enabled and the clock is disabled, and the voltage level of the driving voltage is maintained according to the enabling signal, and after the stop-displaying interval the clock is enabled for outputting the first scan signal.

A touch display apparatus includes a touch driver and a display driver. The touch driver is for outputting a plurality of touch driving signals to drive a touch panel according to an enabling signal. The display driver is for outputting a plurality of scan signals to drive a display panel and for stopping enabling the plurality of scan signals in the enabling period of the enabling signal, and the display driver has a plurality of shift registers, and each of the plurality of shift registers includes a pull-up unit, a driving unit, a pull-down unit, and a holding unit. The pull-up unit is electrically connected to a driving node, and is for outputting a driving voltage to the driving node. The driving unit is electrically connected to the driving node, and is for outputting a first scan signal to an output terminal according to a clock. The pull-down unit is electrically connected to the driving node and the output terminal, and is for pulling down the voltage level of the driving voltage and the output terminal respectively according to the first scan signal and a second scan signal. The holding unit is electrically connected to the driving node, wherein in an enabling period of the enabling signal, the clock is disabled and the voltage level of the driving voltage is maintained according to the enabling signal.

The contents of the present disclosure set forth and the embodiments hereinafter are for demonstrating and illustrating the spirit and principles of the present disclosure, and for providing further explanation of the claims.

BRIEF DESCRIPTION OF THE DRAWINGS

The present disclosure will become more fully understood from the detailed description given hereinbelow and the accompanying drawings, which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings. In addition, the figures in the present disclosure are for the explanation and are not pictured according to the original size. The same component is represented with the same symbol for clearer understanding.

In association with the "first", "second" . . . used in the present disclosure, these terms do not specify an order or sequence and do not limit the present disclosure. The purpose of these terms is for distinguishing the components or operations with the same techniques.

In addition, the term "coupled" or "connection" in the present disclosure refers to the directly physical or electrical contact of two or more components, or indirectly physical or electrical contact of two or more components, or the operation or actuation between two or more components.

Figure 2:
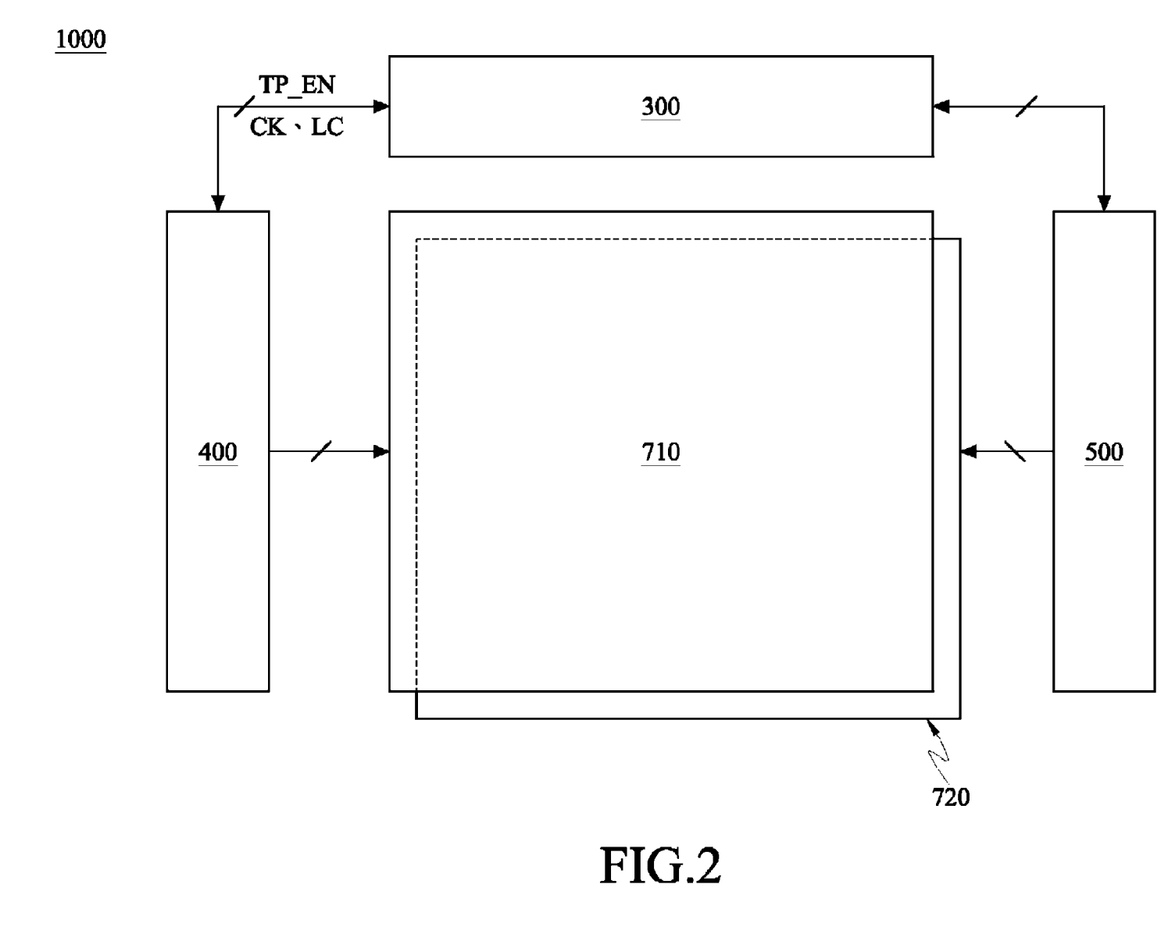
FIG. 2 is a diagram of the touch display apparatus according to an embodiment.

Please refer to FIG. 2. FIG. 2 is a diagram of the touch display apparatus according to an embodiment. As shown in FIG. 2, the touch display apparatus 1000 includes a display driver 400. The display driver 400 outputs the scan signals G(1)~G(N) for driving the scan lines of the display panel 710. The touch driver 500 outputs the touch driving signals S(1)~S(N) for driving the touch lines of the touch panel 720, wherein N is an integer but N does not have the limitation at which the number of the scan signals G(1)~G(N) and the number of the touch driving signals S(1)~S(N) have to be the same. The number of the scan signals G(1)~G(N) and the number of the touch driving signals S(1)~S(N) are different. The touch panel 720 of the touch display apparatus 1000 is, but not limited to, a capacitive touch panel, a photo-sensor panel, a resistive touch panel, an approximately sensing panel. In the present embodiment, the capacitive touch panel is taken as an example. The display panel 710 and the touch panel 720 are, but not limited to, cell touch panels or a combination of the display panel 710 and the touch panel 720. The display driver 400 is for sequentially outputting the scan signals G(1)~G(N) to the display panel 710. The display driver is, but not limited to, a driving chip bonded on the substrate or the Gate driver on Array (GOA) technique on the substrate. The timing controller 300 outputs the signals such as the clock CK, the control signal LC, and the enabling signal TP-EN, for driving the touch driver 500 and the display driver 400. The enabling signal TP_EN is an enabling signal when being touched, a signal for disabling display output, a signal for activating the touch scan, or any external signal. The enabling signal TP_EN can also be directly or indirectly provided to the display driver 400 from the touch driver 500.

Figure 3:
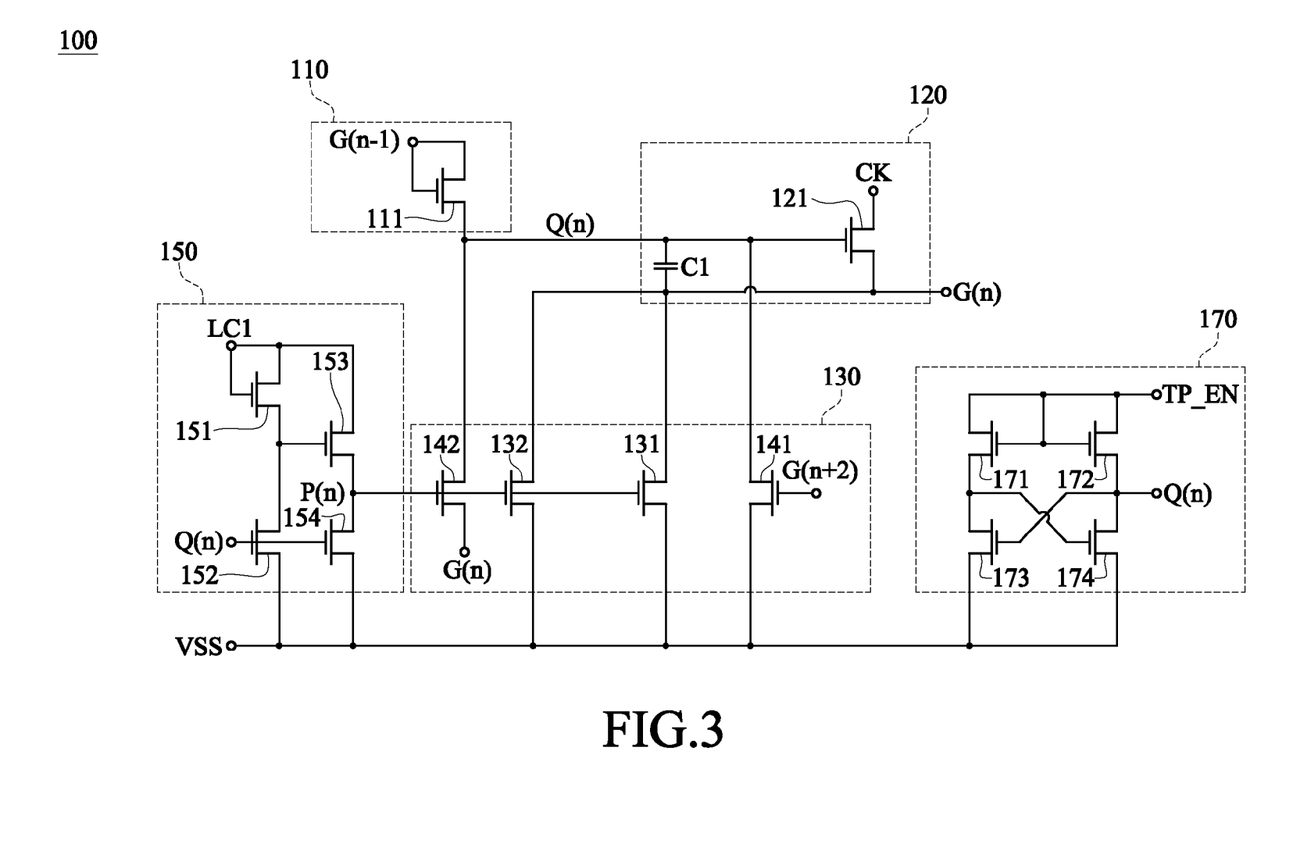
FIG. 3 is a diagram of the shift register circuit according to an embodiment.

Please refer to FIG. 3. FIG. 3 is a diagram of the shift register circuit according to an embodiment. As shown in FIG. 3, the display driver 400 includes a shift register and the shift register includes a plurality of shift register circuits 100. for example, a shift register may has N-stage shift register circuits 100. in other words, a number of the shift register circuits 100 is N. The function of each unit of the plurality of shift register circuits 100 is explained hereinafter. Taking the $n^{th}$ shift register circuit 100 for example, each of the plurality of shift register circuits 100 includes a pull-up unit 110, a driving unit 120, a pull-down unit 130, and a holding unit 170. The pull-up unit 110 has an input terminal and an output terminal, and the output terminal is connected to the node Q, and the input terminal receives the scan signal outputted from the previous-stage shift register unit, such as the scan signal G(n−1) outputted from the $(n-1)^{th}$ shift register circuit, and the driving voltage Q(n) is outputted to the node Q according to the scan signal outputted from the previous shift register unit. The driving unit 120 is electrically connected to the node Q and the pull-up unit 110. The driving unit 120 has an input terminal and an output terminal. The input terminal is for receiving the clock CK and outputs the scan signal G(n) to the output terminal according to the clock CK. The clock CK is the periodically enabled pulse signal, and there is latency in the phase of the clock CK received by the neighboring shift register circuits 100. The pull-down unit 130 is electrically connected to the node Q and the driving unit 120, and adjusts the voltage level of the node Q according to the scan signal G(n). The pull-down unit 130 also adjusts the voltage level of the scan signal G(n) according to the scan signal outputted from the following-stage shift register circuit, wherein the scan signal outputted from the next shift register circuit is, for example, G(n+2), and the next shift register circuit stands for the $(n+2)^{th}$ shift register circuit. The holding unit 170 has an input terminal for receiving the enabling signal TP_EN. The holding unit 170 is electrically connected to the node Q for holding the voltage level of the node Q according to the enabling signal TP_EN received by the input terminal of the holding unit 170, wherein n is an positive integer, represented the $n^{th}$ shift register circuits 100.

The shift register circuit 100 further includes a control unit 150, and the control unit 150 has an input terminal. The control unit 150 is electrically connected to the pull-down unit 130. The control unit 150 is coupled to the voltage source VSS, and has an input terminal for receiving the control signal LC1, and generates the pull-down signal P(n) for the pull-down unit 130 according to the control signal LC1 and the driving signal Q(n). The control signal LC1 is a direct current (DC) voltage with high voltage level in the period of a frame, or a periodically enabled pulse signal. The phases of the control signal LC1 and the clock CK are different. The voltage source VSS is a DC voltage at low voltage level.

Figure 4:
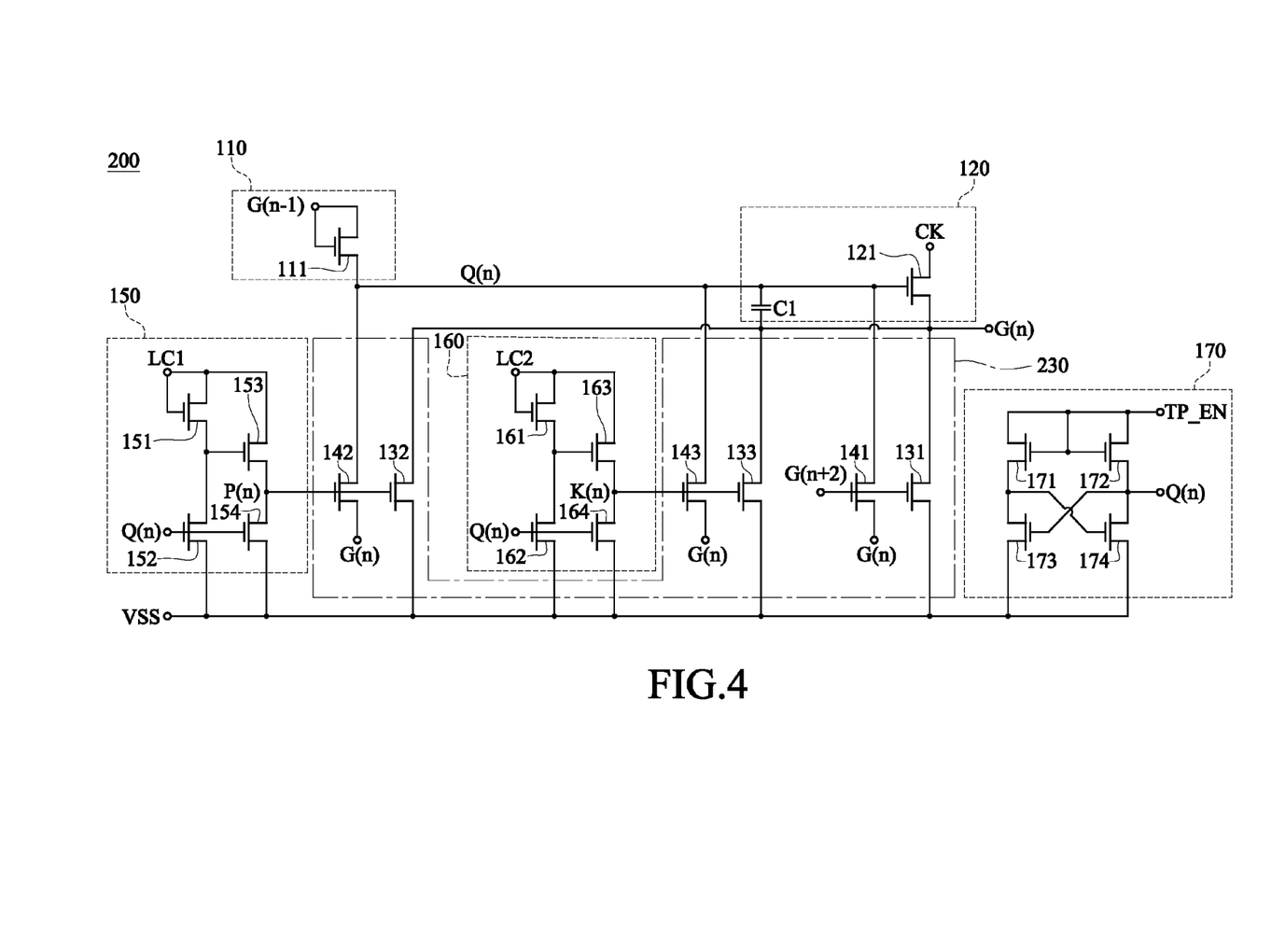
FIG. 4 is a diagram of the shift register circuit according to another embodiment.

Please refer to FIG. 4. FIG. 4 is a diagram of the shift register circuit according to another embodiment. As shown in FIG. 4, the shift register circuit 200 is approximately similar to the shift register circuit 100, so that the figure is labeled with the same component symbols. The difference between the shift register circuit 200 and the shift register circuit 100 is that the shift register circuit 200 further includes a control unit 160. The control unit 160 has an input terminal and is electrically connected to the pull-down unit 130. The control unit 160 is coupled to the voltage source VSS and the input terminal is for receiving the control signal LC2. The control unit 160 generates the pull-down signal K(n) according to the control signal LC2 and the driving signal Q(n) to make the pull-down unit 130 pull down according to the pull-down signal K(n). The control signal LC1 and LC2 have the DC voltages with high voltage level and are alternatively supplied to the shift register circuit 200, or the periodically enabled pulse signals are alternatively supplied to the shift register circuit 200. The phases of the control signal LC1 and LC2 are different or the phases of the control signal LC1 and LC2 are complementary. Comparing to the shift register circuit 100, the shift register circuit 200, by adding the control unit 160, makes the control unit 150 and the control unit 160 alternatively generate the pull-down signals P(n) and K(n) to avoid the electronic components of the control unit 150 being damaged by getting the bias voltage continuously.

Next, the specific connections of the transistors in the shift register circuit 100 are explained hereinafter. Please refer to FIG. 3 again. As the shift register circuit 100 shown in FIG. 3, the pull-up unit 110 has an input terminal and an output terminal, and includes a transistor 111. The transistor 111 has a first terminal, a second terminal, and a gate terminal. The input terminal of the pull-up unit 110 is electrically connected to the first terminal of the transistor 111 to receive the scan signal outputted from the previous shift register unit, such as the scan signal G(n−1). The transistor 111 is diode-connected to the gate terminal of the transistor 111 and to the first terminal of the transistor 111. The output terminal of the pull-up unit 110 is electrically connected to the second terminal of the transistor 111 for being electrically connected to the node Q.

In another embodiment, the pull-up unit 110 includes a transistor 111. The transistor 111 has a first terminal, a second terminal, and a gate terminal. The first terminal of the transistor 111 is for receiving the clock CK2, such as the clock CK2 having a different phase relative to the clock CK1 inputted to the driving unit 120. The control terminal of the transistor 111 is for receiving the scan signal outputted from previous shift register unit, such as the scan signal G(n−1). The output terminal of the pull-up unit 110 is electrically connected to the second terminal of the transistor 111, and is for electrically connecting to the node Q. There are other implementations of the pull-up unit and the implementation in the present embodiment is for illustrating but not for limiting the present disclosure. Generally, the implementation in the present embodiment is suitable for the pull-up unit providing the driving voltage Q(n) to the node Q according to the scan signal outputted from the previous shift register circuit.

The driving unit 120 has an input terminal and an output terminal. The driving unit includes a transistor 121, and the transistor 121 has a first terminal, a second terminal, and a gate terminal. The gate terminal of the transistor 121 is electrically connected to the node Q to receive the driving voltage Q(n). The input terminal of the driving unit 121 is electrically connected to the first terminal of the transistor 121 to receive the clock CK. The output terminal of the driving unit 121 is electrically connected to the second terminal of the transistor 121 to output the scan signal G(n) according to the clock CK. The clock CK is periodically enabled pulse signal and there is a latency in the phase of the clock CK received by the neighboring shift register circuit 100. The driving unit 120 further includes a capacitor C1 electrically connected between the gate terminal of the transistor 121 and the second terminal of the transistor 121. The capacitor C1 saves the electric charges of the node Q and that the electric potential of the driving unit 120 drops too fast is avoided when outputting the scan signal G(n).

The pull-down unit 130 includes a transistor 131, a transistor 132, a transistor 141, and a transistor 142. The transistors 131, 132, 141, 142 have a first terminal, a second terminal, and a gate terminal respectively. The first terminal of the transistor 131 and the first terminal of the transistor 132 are electrically connected to the output terminal of the driving unit 120. The second terminal of the transistor 131 and the second terminal of the transistor 132 are electrically connected to the voltage source VSS. The gate terminal of the transistor 131 and the gate terminal of the transistor 132 are electrically connected to the control unit 150 for pulling down the voltage of the scan signal G(n) according to the pull-down signal P(n). The first terminal of the transistor 141 and the first terminal of the transistor 142 are electrically connected to the node Q. The second terminal of the transistor 141 is electrically connected to the voltage source VSS and receives the scan signal G(n) to pull down the driving voltage Q(n) of the node Q. The second terminal of the transistor 142 is electrically connected to the scan signal G(n). The control terminal of the transistor 141 is electrically connected to the scan signal of the next shift register circuit, such as the G(n+2). The control terminal of the transistor 142 is electrically connected to the output terminal of the control unit 150 for pull down the driving voltage Q(n) of the node Q according to the pull-down signal P(n).

The holding unit 170 has an input terminal for receiving the enabling signal TP_EN, and the holding unit 170 includes a transistor 171, a transistor 172, a transistor 173, and a transistor 174. The transistor 171 has a first terminal, a second terminal, and a gate terminal. The transistor 172 has a first terminal, a second terminal, and a gate terminal. The transistor 173 has a first terminal, a second terminal, and a gate terminal. The transistor 174 has a first terminal, a second terminal, and a gate terminal. The transistor 171 is diode-connected to the transistor 172. The first terminal of the transistor 171, the first terminal of the transistor 172, the gate terminal of the transistor 171, and the gate terminal of the transistor 172 are connected to the input terminal of the holding unit 170 to receive the enabling signal TP_EN. The second terminal of the transistor 172 is electrically connected to the node Q. The first terminal of the transistor 173 is electrically connected to the second terminal of the transistor 171. The first terminal of the transistor 174 is electrically connected the second terminal of the transistor 172. The gate terminal of the transistor 173 is electrically connected to the second terminal of the transistor 172. The gate terminal of the transistor 174 is electrically connected to the second terminal of the transistor 171. The second terminal of the transistor 173 and the second terminal of the transistor 174 are electrically connected to the voltage source VSS. When the enabling signal TP_EN is enabled, the holding unit 170 is electrically connected to the node Q for holding the voltage level of the driving voltage Q(n) to avoid the electric leakage of the node Q with time.

The shift register circuit 100 further includes a control unit 150 for controlling the pull down of the node Q. The control unit 150 has an input terminal including a transistor 151, a transistor 152, a transistor 153, and a transistor 154. The transistors 151, 152, 153, 154 have a first terminal, a second terminal, and a gate terminal respectively. The transistor 151 is diode-connected. The first terminal of the transistor 151 is electrically connected to the gate terminal of the transistor 151 for receiving the control signal LC. The second terminal of the transistor 151 is electrically connected to the first terminal of the transistor 152. The second terminal of the transistor 152 is electrically connected to the voltage source VSS. The gate terminal of the transistor 152 is electrically connected to the node Q. The first terminal of the transistor 153 is electrically connected to the first terminal of the transistor 151. The gate terminal of the transistor 153 is electrically connected to the second terminal of the transistor 151. The second terminal of the transistor 153 is electrically connected to the first terminal of the transistor 154 and to the pull-down unit 130 for generating the pull-down signal P(n). The second terminal of the transistor 154 is electrically connected to the voltage source VSS. The gate terminal of the transistor 154 is electrically connected to the gate terminal of the transistor 152. The control unit 150 makes the second terminal of the transistor 153 generate the pull-down signal P(n) according to the control signal LC and the driving voltage Q(n) of the node Q, and pull downs the driving voltage Q(n) of the node Q according to the pull-down signal P(n).

Please refer to FIG. 4 again. The shift register circuit 200 further includes a control unit 160 and a control unit 150 to alternatively control the pulling down of the node Q. The control unit 160 has an input terminal and includes a transistor 161, a transistor 162, a transistor 163, and a transistor 164. The transistors 161, 162, 163, 164 have a first terminal, a second terminal, and a gate terminal respectively. The transistor 161 is diode-connected. The first terminal of the transistor 161 is electrically connected to the gate terminal of the transistor 161 for receiving the control signal LC. The second terminal of the transistor 161 is electrically connected to the first terminal of the transistor 162. The second terminal of the transistor 162 is electrically connected to the voltage source VSS. The gate terminal of the transistor 162 is electrically connected to the node Q. The first terminal of the transistor 163 is electrically connected to the first terminal of the transistor 161. The gate terminal of the transistor 163 is electrically connected to the second terminal of the transistor 161. The second terminal of the transistor 163 is electrically connected to the first terminal of the transistor 164 and to the pull-down unit 230 for generating the pull-down signal K(n). The second terminal of the transistor 164 is electrically connected to the voltage source VSS. The gate terminal of the transistor 164 is electrically connected to the gate terminal of the transistor 162. The control unit 160 makes the second terminal of the transistor 163 generate the pull-down signal K(n) according to the control signal LC and the driving voltage Q(n) of the node Q, and pull downs the driving voltage Q(n) of the node Q according to the pull-down signal K(n). The control signal LC1 and LC2 have the DC voltage with high voltage level and are alternatively supplied to the shift register circuit 200, or the periodically enabled pulse signal are alternatively supplied to the shift register circuit 200. The phases of the control signal LC1 and LC2 are different or the phases of the control signal LC1 and LC2 are complementary.

As shown in FIG. 4, the pull-down unit 230 in the shift register circuit 200 is almost similar to the pull-down unit 130 in the shift register circuit 100. There are a transistor 131, a transistor 132, a transistor 141, and a transistor 142 in the shift register circuit 200 and in the shift register circuit 100. The pull-down unit 230 further includes a transistor 133 and a transistor 143. The transistor 133 has a first terminal, a second terminal, and a gate terminal, and the transistor 134 has a first terminal, a second terminal, and a gate terminal. The first terminal of the transistor 133 is electrically connected to the output terminal of the driving unit 120, and the second terminal of the transistor 133 is electrically connected the voltage source VSS. The first terminal of the transistor 143 is electrically connected to the node Q, and the second terminal of the transistor 143 is electrically connected to the scan signal G(n). The gate terminal of the transistor 133 and the gate terminal of the transistor 143 are electrically connected to the control unit 160 for pulling down the voltages of the scan signal G(n) and the node Q(n) according to the pull-down signal K(n).

Figure 5:
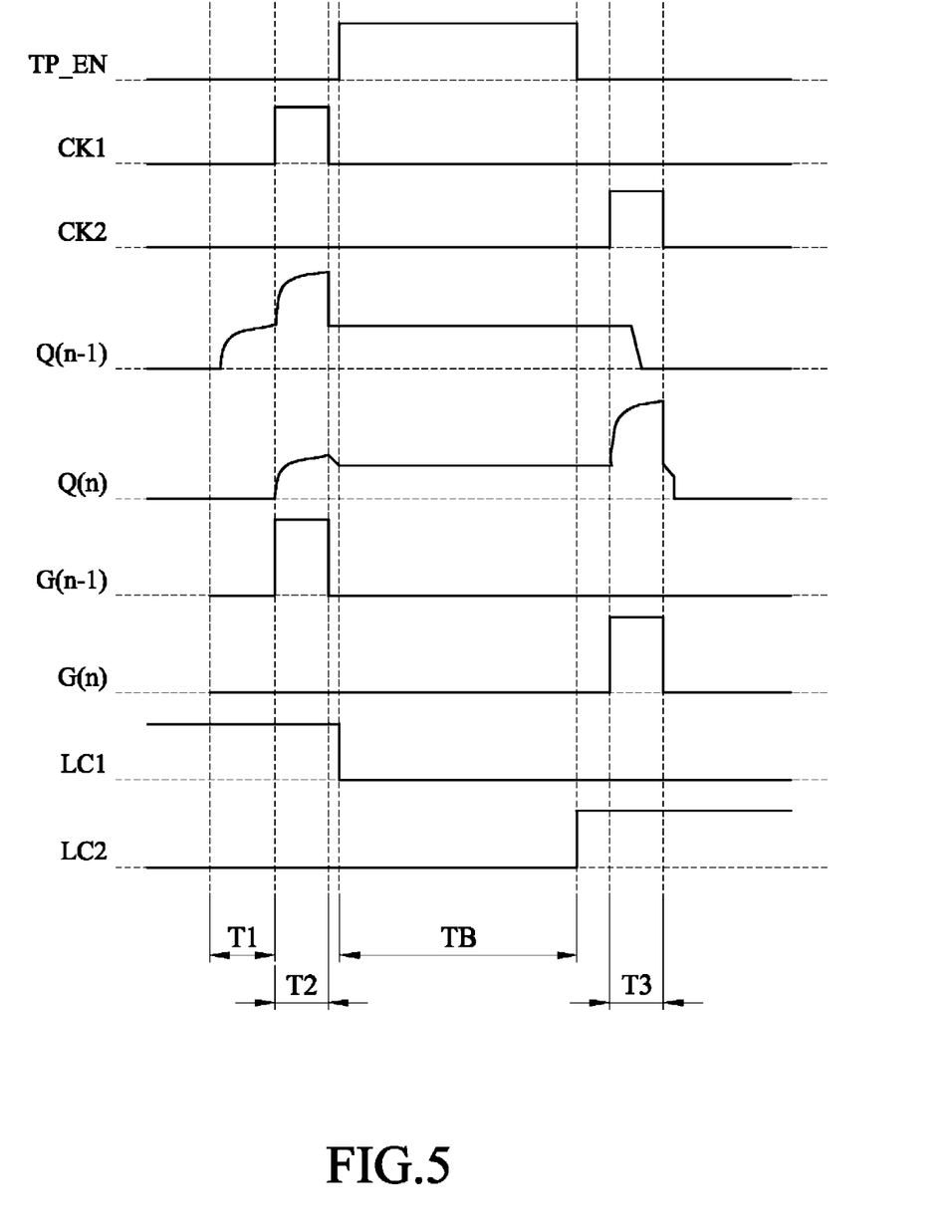
FIG. 5 is a waveform diagram of the shift register circuit according to the embodiments in FIG. 3 and FIG. 4.

Please refer to FIG. 5. FIG. 5 is a waveform diagram of the shift register circuit according to the embodiments in FIG. 3 and FIG. 4. Please refer to the shift register circuit 200 in FIG. 4 with FIG. 5. The actuation of the shift register circuit 200 is explained hereinafter. In T1, the pull-up unit 110 of the $(n-1)^{th}$ shift register circuit 200 receives the scan signal G(n−2) from the previous to pull up the driving voltage of the node Q(n−1). In T2, when the clock CK1 is inputted to the $(n-1)^{th}$ driving unit 120, the driving voltage Q(n−1) continuously charges the node to pull up the driving voltage Q(n−1) and outputs the scan signal G(n−1). Meanwhile, the pull-up unit 110 of the $n^{th}$ shift register unit 200 receives the scan signal G(n−1) and charges the driving voltage Q(n). When the enabling signal TP_EN is enabled in TB, the clock CK1, the clock CK2, the control signal LC1, and the control signal LC2 are disabled and are not to be inputted to the shift register circuit 200. The input terminal of the holding unit 170 of each of the plurality of shift register circuits 200 receives the enabling signal TP_EN, so that the transistors 171, 172, 173, 174 lock the voltage level of the node Q to avoid the node Q to leak with time and the driving voltage Q(n−1) and Q(n) are maintained in high voltage level. In T3, the enabling signal TP_EN is disabled, and the clock CK1, the clock CK2, the control signal LC2 are resumed to be enabled, and the clock CK2 is inputted to the $n^{th}$ driving unit 120. At the same time, the driving voltage Q(n) continuously charges the node to pull up the driving voltage Q(n) and outputs the scan signal G(n) with correct waveforms.

The display device used by the shift register circuit 100 of the present disclosure is, for example, the touch display apparatus 1000 in FIG. 1. When the timing controller 300 outputs the touch enabling signal TP_EN to the display driver 400 and the touch driver 500, the shift register 100 in the display driver 400 stops outputting. The time when the enabling signal TP_EN is enabled is, but not limited to the enabled period by touching, the blanking period between two neighboring frame periods, the blanking period between the scan signals, the period when the touch display apparatus 1000 detects the occurrence of a touch event, or the period when the display driver 400 receives a command to stop outputting. The shift register circuit 100 of the present disclosure is applied to avoid outputting incorrect waveforms from the display driver 400 when the display driver 400 receives the command to stop outputting the scan signal to the display panel 710. The enabling signal TP_EN is, but not limited to, provided by the timing controller 300 or by the touch driver 500. Persons skilled in the art understand that the present disclosure is achievable when the signal inputted to the shift register circuit 100 simultaneously disables the external control signal.

The integrated mobile device applying the shift register circuit 100 of the present disclosure is disclosed, such as a touch display apparatus, a photo-sensor display apparatus, a finger print recognition display device . . . etc. As long as the display driver 400 receives the command and stops outputting the scan signal to the display panel 710, the shift register circuit 100 of the present disclosure is available to be applied to the device to avoid outputting incorrect waveforms from the display driver 400, so that the display quality is enhanced. The present embodiment is for illustrating but not for limiting the present disclosure. The shift register is applied to the integrated driving device including two or more drivers to avoid outputting incorrect waveform from the drivers.

The shift register circuit of the present disclosure provides a driving structure at which the voltage level of the internal node is maintained through the external control signal when the shift register circuit stops operating. Therefore, the electric leakage of the shift register circuit is avoided, and incorrect displaying is further avoided, and outputting the correct waveform from the shift register circuit is ensured.

The foregoing description has been presented for purposes of illustration. It is not exhaustive and does not limit the disclosure to the precise forms or embodiments disclosed. Modifications and adaptations will be apparent to those skilled in the art from consideration of the specification and practice of the disclosed embodiments of the disclosure. It is intended, therefore, that the specification and examples be considered as exemplary only, with a true scope and spirit of the disclosure being indicated by the following claims and their full scope of equivalents.

What is claimed is:

1. A touch display apparatus, comprising:
   a touch driver for outputting a plurality of touch driving signals to drive a touch panel;
   a display driver for outputting a plurality of scan signals to drive a display panel, the display driver having a plurality of shift registers, a $N^{th}$ shift register comprising:
      a pull-up unit electrically connected to a driving node, for outputting a driving voltage to the driving node;
      a driving unit electrically connected to the driving node, for outputting a $N^{th}$ scan signal according to a clock;
      a pull-down unit electrically connected to the driving node and the output terminal, for pulling down the voltage level of the driving voltage and the output terminal respectively according to the $N^{th}$ scan signal and a $M^{th}$ scan signal, wherein N, M are positive integers and M is greater than N; and
      a holding unit electrically connected to the driving node, wherein in a stop-displaying interval after the outputting a $(N-1)^{th}$ scan signal, the holding unit is enabled according to an enabling signal to maintain the voltage level of the driving voltage, and the clock is disabled to disable the $N^{th}$ scan signal, and after the stop-displaying interval, the enabling signal is disabled and the clock is enabled to enable the $N^{th}$ scan signal.

2. The touch display apparatus of claim 1, wherein the holding unit comprises:
   a first transistor having a first terminal, a second terminal, and a gate terminal, wherein the first terminal is configured for receiving the enabling signal;
   a second transistor having a first terminal, a second terminal, and a gate terminal, wherein the first terminal is configured for receiving the enabling signal, and the second terminal is electrically connected to the driving node, and the gate terminal is electrically connected to the gate terminal of the first transistor;
   a third transistor having a first terminal, a second terminal, and a gate terminal, wherein the first terminal is electrically connected to the second terminal of the first transistor, and the second terminal is electrically connected to a voltage source, and the gate terminal is electrically connected to the second terminal of the second transistor; and
   a fourth transistor having a first terminal, a second terminal, and a gate terminal, wherein the first terminal is electrically connected to the second terminal of the second transistor, and the second terminal is electrically connected to the voltage source, and the gate terminal is electrically connected to the second terminal of the first transistor.

3. A shift register, comprising:
   a pull-up unit electrically connected to a driving node, for outputting a driving voltage to the driving node;
   a driving unit electrically connected to the driving node, for outputting a first scan signal to an output terminal according to a clock;
   a pull-down unit electrically connected to the driving node and the output terminal, for pulling down the voltage level of the driving voltage and the output terminal respectively according to the first scan signal and a second scan signal; and
   a holding unit electrically connected to the driving node, wherein in a stop-displaying interval, the first scan signal is disabled and an enabling signal is enabled and the clock is disabled, and the voltage level of the driving voltage is maintained according to the enabling signal, and after the stop-displaying interval the clock is enabled for outputting the first scan signal.

4. The shift register of claim 3, wherein the holding unit comprises:
   a first transistor having a first terminal, a second terminal, and a gate terminal, wherein the first terminal is electrically connected to the gate terminal of the first transistor and is for receiving the enabling signal;
   a second transistor having a first terminal, a second terminal, and a gate terminal, wherein the first terminal is electrically connected to the first terminal of the first transistor, and the second terminal is electrically connected to the driving node, and the gate terminal is electrically connected to the gate terminal of the first transistor;
   a third transistor having a first terminal, a second terminal, and a gate terminal, wherein the first terminal is electrically connected to the second terminal of the first transistor, and the second terminal is electrically connected to a voltage source, and the gate terminal is electrically connected to the second terminal of the second transistor; and
   a fourth transistor having a first terminal, a second terminal, and a gate terminal, wherein the first terminal is electrically connected to the second terminal of the second transistor, and the second terminal is electrically connected to the voltage source, and the gate terminal is electrically connected to the second terminal of the first transistor.

5. The shift register of claim 3, wherein the stop-displaying interval is happened in a frame period.

6. The shift register of claim 3, wherein the stop-displaying interval is happened in a blanking period between two neighboring frame periods or in a blanking period between two scan signals.

7. The shift register of claim 3, wherein the pull-up unit comprises:
   a fifth transistor having a first terminal, a second terminal, and a gate terminal, wherein the first terminal is electrically connected to the gate terminal and is for receiving a third scan signal, and the second terminal is electrically connected to the driving node.

8. The shift register of claim 3, wherein the driving unit comprises:

a sixth transistor having a first terminal, a second terminal, and a gate terminal, wherein the first terminal is for receiving the clock, and the gate terminal is electrically connected to the driving node, and the second terminal is configured for outputting the first scan signal according to the clock and the driving voltage.

9. The shift register of claim 3, further comprising:
a first control unit electrically connected to the driving node, for adjusting the voltage level of the driving voltage according to a first control signal, wherein the first control signal is disabled in the stop-displaying interval.

10. The shift register of claim 9, wherein the first control unit comprises:
a seventh transistor having a first terminal, a second terminal, and a gate terminal, wherein the first terminal is electrically connected to the gate terminal and is configured for receiving the first control signal;
an eighth transistor having a first terminal, a second terminal, and a gate terminal, wherein the first terminal is electrically connected to the second terminal of the seventh transistor and the second terminal is electrically connected to the voltage source, and the gate terminal is electrically connected to the driving node;
a ninth transistor having a first terminal, a second terminal, and a gate terminal, wherein the first terminal is electrically connected to the first terminal of the seventh transistor, and the gate terminal is electrically connected to the second terminal of the seventh transistor; and
a tenth transistor having a first terminal, a second terminal, and a gate terminal, wherein the first terminal is electrically connected to the second terminal of the ninth transistor, and the gate terminal is electrically connected to the gate terminal of the eighth transistor, and the second terminal is electrically connected to the voltage source.

11. The shift register of claim 9, wherein the pull-down unit further comprises:
an eleventh transistor having a first terminal, a second terminal, and a gate terminal, wherein the first terminal is electrically connected to the output terminal and the gate terminal is configured for receiving the second scan signal;
a twelfth transistor having a first terminal, a second terminal, and a gate terminal, wherein the first terminal is electrically connected to the driving node and the second terminal is electrically connected to the first scan signal, and the gate terminal is electrically connected to the gate terminal of the eleventh transistor;
a thirteenth transistor having a first terminal, a second terminal, and a gate terminal, wherein the first terminal is electrically connected to the output terminal, and the second terminal is electrically connected to the voltage source, and the gate terminal is electrically connected to the first control unit; and
a fourteenth transistor having a first terminal, a second terminal, and a gate terminal, wherein the first terminal is electrically connected to the driving node, and the second terminal is electrically connected to the voltage source, and the gate terminal is electrically connected to the first control unit.

12. The shift register of claim 9, further comprising:
a second control unit electrically connected to the driving node, for adjusting the voltage level of the driving voltage according to a second control signal, wherein the first control signal and the second control signal are complementary, and the second control signal is disabled in the stop-displaying interval.

13. The shift register of claim 12, wherein the second control unit comprises:
a fifteenth transistor having a first terminal, a second terminal, and a gate terminal, wherein the first terminal is electrically connected to the gate terminal and is configured for receiving the second control signal;
a sixteenth transistor having a first terminal, a second terminal, and a gate terminal, wherein the first terminal is electrically connected to the second terminal of the fifteenth transistor, and the second terminal is electrically connected to the voltage source, and the gate terminal is electrically connected to the driving node;
a seventeenth transistor having a first terminal, a second terminal, and a gate terminal, wherein the first terminal is electrically connected to the first terminal of the fifteenth transistor, and the gate terminal is electrically connected to the second terminal of the fifteenth transistor; and
an eighteenth transistor having a first terminal, a second terminal, and a gate terminal, wherein the first terminal is electrically connected to the second terminal of the seventeenth transistor, and the gate terminal is electrically connected to the gate terminal of the sixteenth transistor, and the second terminal is electrically connected to the voltage source.

14. The shift register of claim 13, wherein the pull-down unit further comprises:
a nineteenth transistor having a first terminal, a second terminal, and a gate terminal, wherein the first terminal is electrically connected to the output terminal, and the second terminal is electrically connected to the voltage source, and the gate terminal is electrically connected to the second control unit; and
a twentieth transistor having a first terminal, a second terminal, and a gate terminal, wherein the first terminal is electrically connected to the driving node, and the second terminal is electrically connected to the voltage source, and the gate terminal is electrically connected to the second control unit.

15. A touch display apparatus, comprising:
a touch driver, configured for outputting a plurality of touch driving signals to drive a touch panel according to an enabling signal;
a display driver, configured for outputting a plurality of scan signals to drive a display panel and for stopping outputting the plurality of scan signals in an enabling period of the enabling signal, the display driver having a plurality of shift registers, each of the plurality of shift registers comprising:
a pull-up unit electrically connected to a driving node, for outputting a driving voltage to the driving node;
a driving unit electrically connected to the driving node, for outputting a first scan signal to an output terminal according to a clock;
a pull-down unit electrically connected to the driving node and the output terminal, for pulling down the voltage level of the driving voltage and the output terminal respectively according to the first scan signal and a second scan signal; and
a holding unit electrically connected to the driving node, wherein in the enabling period, the clock is disabled and the voltage level of the driving voltage is maintained according to the enabling signal.

16. The touch display apparatus of claim 15, wherein the holding unit comprises:

a first transistor having a first terminal, a second terminal, and a gate terminal, wherein the first terminal is for receiving the enabling signal;

a second transistor having a first terminal, a second terminal, and a gate terminal, wherein the first terminal is for receiving the enabling signal, and the second terminal is electrically connected to the driving node, and the gate terminal is electrically connected to the gate terminal of the first transistor;

a third transistor having a first terminal, a second terminal, and a gate terminal, wherein the first terminal is electrically connected to the second terminal of the first transistor, and the second terminal is electrically connected to a voltage source, and the gate terminal is electrically connected to the second terminal of the second transistor; and a fourth transistor having a first terminal, a second terminal, and a gate terminal, wherein the first terminal is electrically connected to the second terminal of the second transistor, and the second terminal is electrically connected to a voltage source, and the gate terminal is electrically connected to the second terminal of the first transistor.

17. The touch display apparatus of claim 15, wherein the stop-displaying interval is happened in a frame period.

18. The touch display apparatus of claim 15, wherein the stop-displaying interval is happened in a blanking period between two neighboring frame periods or in a blanking period between two scan signals.

19. The touch display apparatus of claim 15, further comprising:

a timing controller electrically connected to the touch driver and the display driver, wherein the enabling signal and the clock are provided by the timing controller.

* * * * *